(12) United States Patent
Chakkirala et al.

(10) Patent No.: US 10,177,940 B1
(45) Date of Patent: Jan. 8, 2019

(54) SYSTEM AND METHOD FOR DATA TRANSMISSION

(71) Applicant: Cadence Design Systems, Inc., San Jose, CA (US)

(72) Inventors: Sumanth Chakkirala, Bangalore (IN); Tamal Das, Bangalore (IN); Vishnu Kalyanamahadevi Goplalan Jawarlal, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/627,940

(22) Filed: Jun. 20, 2017

(51) Int. Cl.
  *H04L 25/02* (2006.01)
  *H04B 1/40* (2015.01)
  *G01R 31/28* (2006.01)
  *H04L 25/49* (2006.01)

(52) U.S. Cl.
  CPC ...... *H04L 25/0292* (2013.01); *G01R 31/2851* (2013.01); *H04B 1/40* (2013.01); *H04L 25/0272* (2013.01); *H04L 25/49* (2013.01)

(58) Field of Classification Search
  CPC .................................................. H04L 25/0292
  USPC ....................................................... 375/324
  See application file for complete search history.

(56) References Cited

U.S. PATENT DOCUMENTS

| | | | | |
|---|---|---|---|---|
| 6,448,917 B1* | 9/2002 | Leung | ................. | H03M 1/0663 341/144 |
| 9,030,256 B2* | 5/2015 | Jones | .................... | H03F 1/0227 330/127 |
| 2008/0061818 A1* | 3/2008 | Santurkar | .......... | H03K 19/0005 326/30 |
| 2008/0185653 A1* | 8/2008 | Okamoto | ............ | H01L 27/0266 257/361 |
| 2009/0190648 A1* | 7/2009 | Sakano | .................. | G09G 5/003 375/232 |
| 2013/0074897 A1* | 3/2013 | Yang | ....................... | H01L 35/34 136/200 |
| 2017/0155243 A1* | 6/2017 | Tan | ........................ | H02H 9/046 |

OTHER PUBLICATIONS

Gupta, Nitin et al., "HDMI Transmitter in 32nM Technology using 28Å MOS," IEEE 2012, pp. 1951-1954 (2012).
Ker, Ming-Dou et al., "Design on Mixed-Voltage I/O Buffer With Blocking NMOS and Dynamic Gate-Controlled Circuit for High-Voltage-Tolerant Applications," IEEE 2005, pp. 1859-1862 (2005).
Ker, Ming-Dou et al., "Whole-Chip ESD Protection Scheme for CMOS Mixed-Mode IC's in Deep-Submicron CMOS Technology," IEEE 1997 Custom Integrated Circuits Conference, pp. 31-34 (1997).
Maloney, Timothy J. et al., "Novel Clamp Circuits for IC Power Supply Protection," EOS/ESDS Symposium, pp. 95-1-95-11.

* cited by examiner

*Primary Examiner* — Lihong Yu
(74) *Attorney, Agent, or Firm* — Mark H. Whittenberger, Esq.; Holland & Knight LLP

(57) ABSTRACT

The present disclosure relates to an apparatus for use in a transition-minimized differential signaling link ("TMDS") receiver. The apparatus may include an integrated circuit electrically connected with a voltage supply. The integrated circuit may include a first transistor, a second transistor, and a resistor arranged in a cascaded configuration along a termination path. The first transistor may include calibration code control configured to adjust an output impedence.

11 Claims, 13 Drawing Sheets

800

SYSTEM AND METHOD FOR DATA TRANSMISSION

FIELD OF THE INVENTION

The present disclosure relates to electronic circuits and more specifically, to a system and method for enabling efficient data transmission between a transmitter and receiver.

DISCUSSION OF THE RELATED ART

Transition-minimized differential signaling (TMDS) involves a technology for transmitting high-speed serial data. TMDS may be used by the digital visual interface ("DVI") and high-definition multimedia interface ("HDMI") video interfaces, as well as by other digital communication interfaces. The transmitter incorporates an advanced coding algorithm that may reduce electromagnetic interference over copper cables and enables robust clock recovery at the receiver to achieve high skew tolerance for driving longer cables as well as shorter low-cost cables.

In existing systems, a cascade topology is used to protect the 1.8V devices from 3.3V supply. See, *HDMI Transmitter in 32 nM Technology using 28 Å MOS* "Nitin Gupta, Tapas Nandy and Somnath Kundu"; *IEEE*. This solution may work for a ground referred driver. Since the NMOS devices are used, in absence of supply, the NMOS devices and hence termination path may automatically get turned off. However, this solution will not work for supply referred termination because PMOS devices will be used in the termination unit. In the absence of a sink supply, PMOS gate voltages need to be generated to turn off the termination.

In other existing systems, the gate of the device that interfaces with the 3.3V domain may be dynamically controlled. See, *Design on Mixed-Voltage I/O Buffer With Blocking NMOS and Dynamic Gate-Controlled Circuit for High-Voltage-Tolerant Applications* "Ming-Dou Ker, Shih-Lun Chen, and Chia-Sheng Tsai"; *IEEE*. The problem with this approach is that it requires extra complex circuitry to dynamically control the gate. Another issue is to make this circuitry work in the absence of the receiver supply.

SUMMARY

In one or more embodiments of the present disclosure, an apparatus for use in a transition-minimized differential signaling link ("TMDS") receiver is provided. The apparatus may include an integrated circuit electrically connected with a voltage supply. The integrated circuit may include a first transistor, a second transistor, and a resistor arranged in a cascaded configuration along a termination path. The first transistor may include calibration code control configured to adjust an output impedance.

One or more of the following features may be included. The voltage supply may be a 3.3V voltage supply. The first transistor and the second transistor may include a 1.8 V metal-oxide-semiconductor field-effect transistors ("MOSFETs"). The integrated circuit may further include a third transistor and a fourth transistor arranged in a second cascaded configuration and arranged to bias the second transistor. The integrated circuit may further include a bulk generation circuit. The integrated circuit may further be associated with a High-Definition Multimedia Interface ("HDMI") system. The bulk generation circuit may include a peak detector circuitry.

In one or more embodiments of the present disclosure, a direct current ("DC") coupled High-Definition Multimedia Interface ("HDMI") system is provided. The system may include a transmitter and a receiver in communication with the transmitter. The receiver may include a calibration digital to analog converter ("DAC") including a plurality of integrated circuits. Each of the integrated circuits may be electrically connected with a voltage supply and may include a first transistor, a second transistor, and a resistor arranged in a cascaded configuration along a termination path. The first transistor may include calibration code control.

One or more of the following features may be included. The voltage supply may include a 3.3V voltage supply. The first transistor and the second transistor may be 1.8 V metal-oxide-semiconductor field-effect transistors ("MOSFETs"). The integrated circuit may include a third transistor and a fourth transistor arranged in a second cascaded configuration and arranged to bias the second transistor. The integrated circuit may further include a bulk generation circuit. The calibration DAC may include a plurality of arms and each of the plurality of arms may include one of the plurality of integrated circuits. The bulk generation circuit may include a peak detector circuitry.

In one or more embodiments of the present disclosure, a method for use in a transition-minimized differential signaling link ("TMDS") receiver is provided. The method may include providing an integrated circuit electrically connected with a voltage supply, the integrated circuit including a first transistor, a second transistor, and a resistor arranged in a cascaded configuration along a termination path. The method may include adjusting an output impedence of the first transistor using a calibration code control. The method may also include reducing leakage of a data link associated with the termination path wherein reducing leakage includes biasing the second transistor using a third transistor and a fourth transistor arranged in a second cascaded configuration.

One or more of the following features may be included. The voltage supply may be a 3.3V voltage supply and the first transistor and the second transistor are 1.8 V metal-oxide-semiconductor field-effect transistors ("MOSFETs"). The integrated circuit may further include a bulk generation circuitry. The bulk generation circuitry may include peak detection circuitry. In some embodiments, providing the integrated circuit may include providing the integrated circuit within each arm of a digital to analog converter ("DAC"). The integrated circuit may be associated with a High-Definition Multimedia Interface ("HDMI") system.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
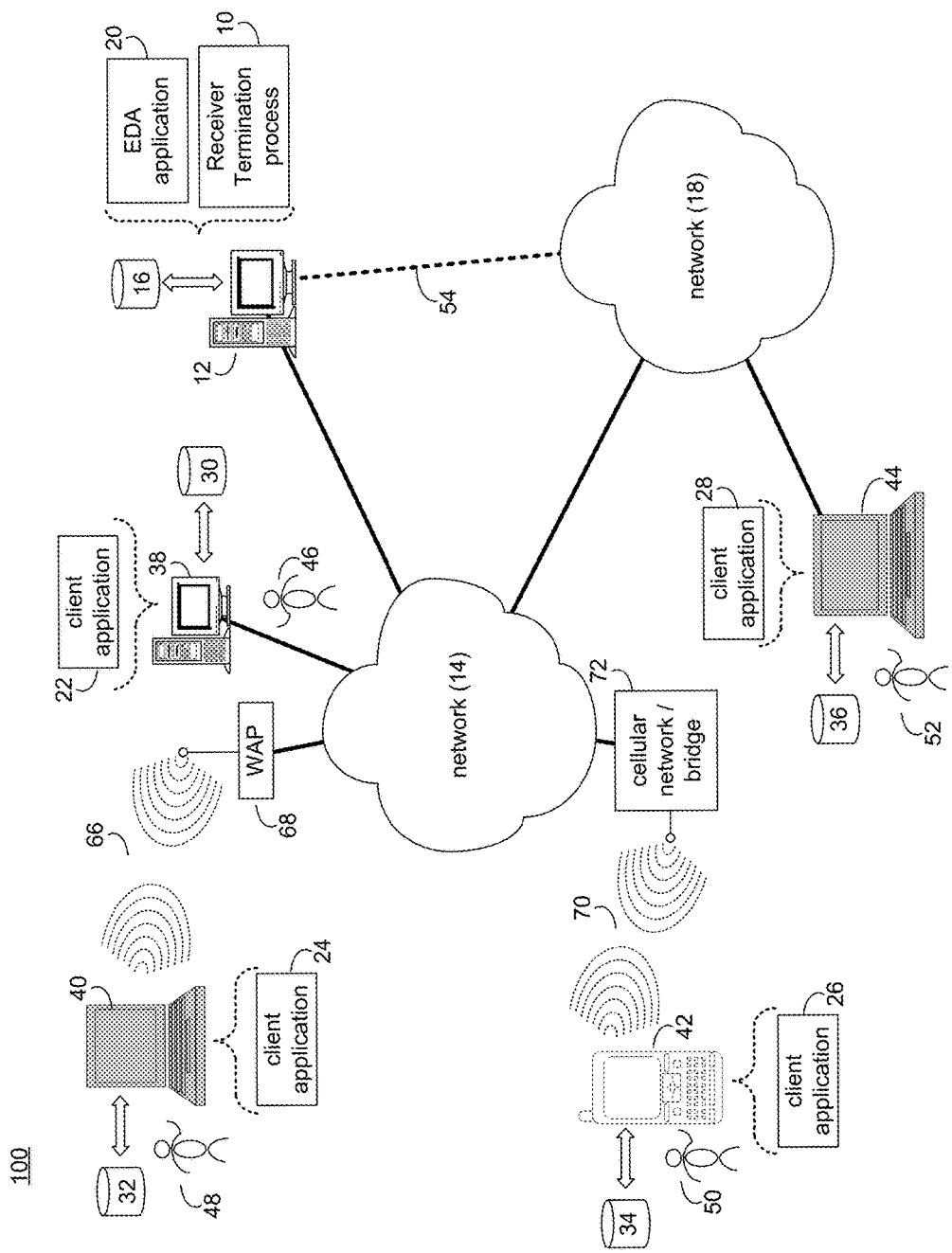
FIG. 1 is a system diagram depicting aspects of the receiver termination process in accordance with an embodiment of the present disclosure.

Referring to FIG. 1, there is shown receiver termination process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the receiver termination process may reside on and be executed, in whole or in part, by a client electronic device, such as a personal computer, notebook computer, personal digital assistant, or the like.

The instruction sets and subroutines of receiver termination process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Receiver termination process 10 may be a stand-alone application, or may be an applet/application/script that may interact with and/or be executed within EDA application 20. In addition/as an alternative to being a server-side process, the receiver termination process may be a client-side process (not shown) that may reside on a client electronic device (described below) and may interact with an EDA client application (e.g., one or more of EDA client applications 22, 24, 26, 28). Further, the receiver termination process may be a hybrid server-side/client-side process that may interact with EDA application 20 and an EDA client application (e.g., one or more of client applications 22, 24, 26, 28). As such, the receiver termination process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize receiver termination process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
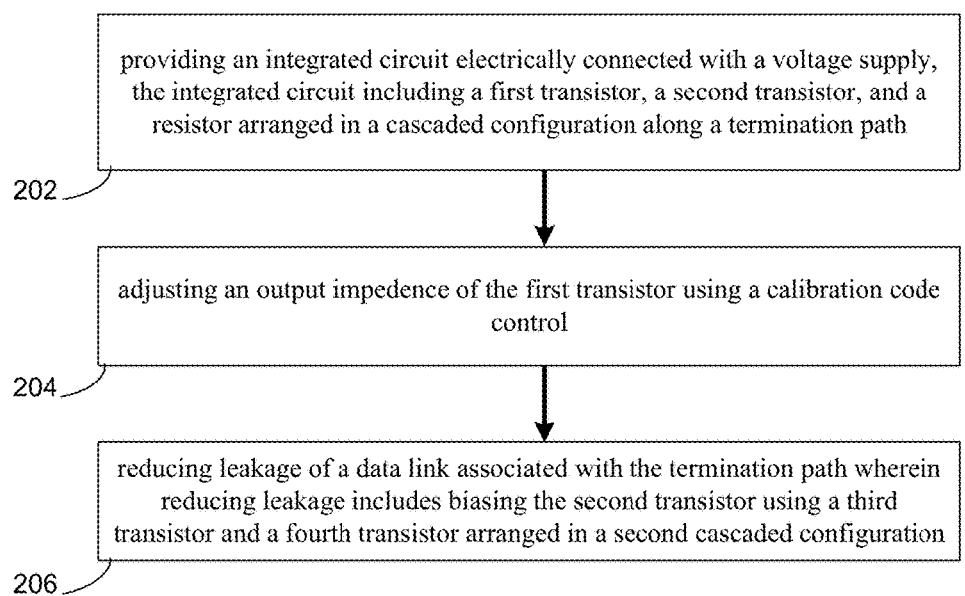
FIG. 2 is a flowchart depicting operations consistent with the receiver termination process of the present disclosure.

Referring to FIGS. 2-13, various embodiments consistent with receiver termination process 10 are provided. As shown in FIG. 2, embodiments of receiver termination process 10 may be used in a transition-minimized differential signaling link ("TMDS") receiver. The method may include providing (202) an integrated circuit electrically connected with a voltage supply, the integrated circuit including a first transistor, a second transistor, and a resistor arranged in a cascaded configuration along a termination path. The method may also include adjusting (204) an output impedance of the first transistor using a calibration code control and reducing (206) leakage of a data link associated with the termination path wherein reducing leakage includes biasing the second transistor using a third transistor and a fourth transistor arranged in a second cascaded configuration.

In some embodiments, IBIS models may be used for Single-Ended IO-buffers and IBIS-AMI models may be used for Differential IO-buffers. In some embodiments, single-ended IO-buffers may be used for single-ended signaling of the inputs and outputs of a channel. Single-ended signaling as used herein may include, but is not limited to, transmission of a signal across two conductors (e.g., wires, or traces in an electronic circuit) where one conductor may carry an applied voltage and the other conductor may carry a reference voltage or ground, as is known in the art. Advantages of single-ended signaling may include, but are not limited to, a lower implementation expense compared to differential signaling and signal-ended signaling may require fewer wires than differential signaling. For example, to transmit n signals, n+1 wires may be needed for single-ended signaling (e.g., one bit may require two wires but two bits may require three wires). Disadvantages of single-ended signaling may include, but are not limited to, an inability to filter noise and potential induction between two or more wires.

In some embodiments, differential IO-buffers may be used for differential signaling of the inputs and outputs of a channel. Differential signaling as used herein may include, but is not limited to, transmitting the same signal as a differential pair of signals, each in its own wire, as is known in the art. The receiving circuit may respond to the electrical difference between the two signals, rather than the difference between an applied voltage on a single wire and a reference voltage. In differential signaling, one bit may be transferred on two wires. Advantages of differential signaling may include, but are not limited to, noise cancelling and power efficiency. Disadvantages of differential signaling may include, but are not limited to, the need for more wires to transmit signals than required for single-ended signaling. For example, to transmit n signals, 2n wires (e.g., n signals multiplied by 2) may be needed for differential signaling (e.g., one bit may requires two wires but two bits may require four wires where each additional bit may require an independent pair of wires).

Figure 3:
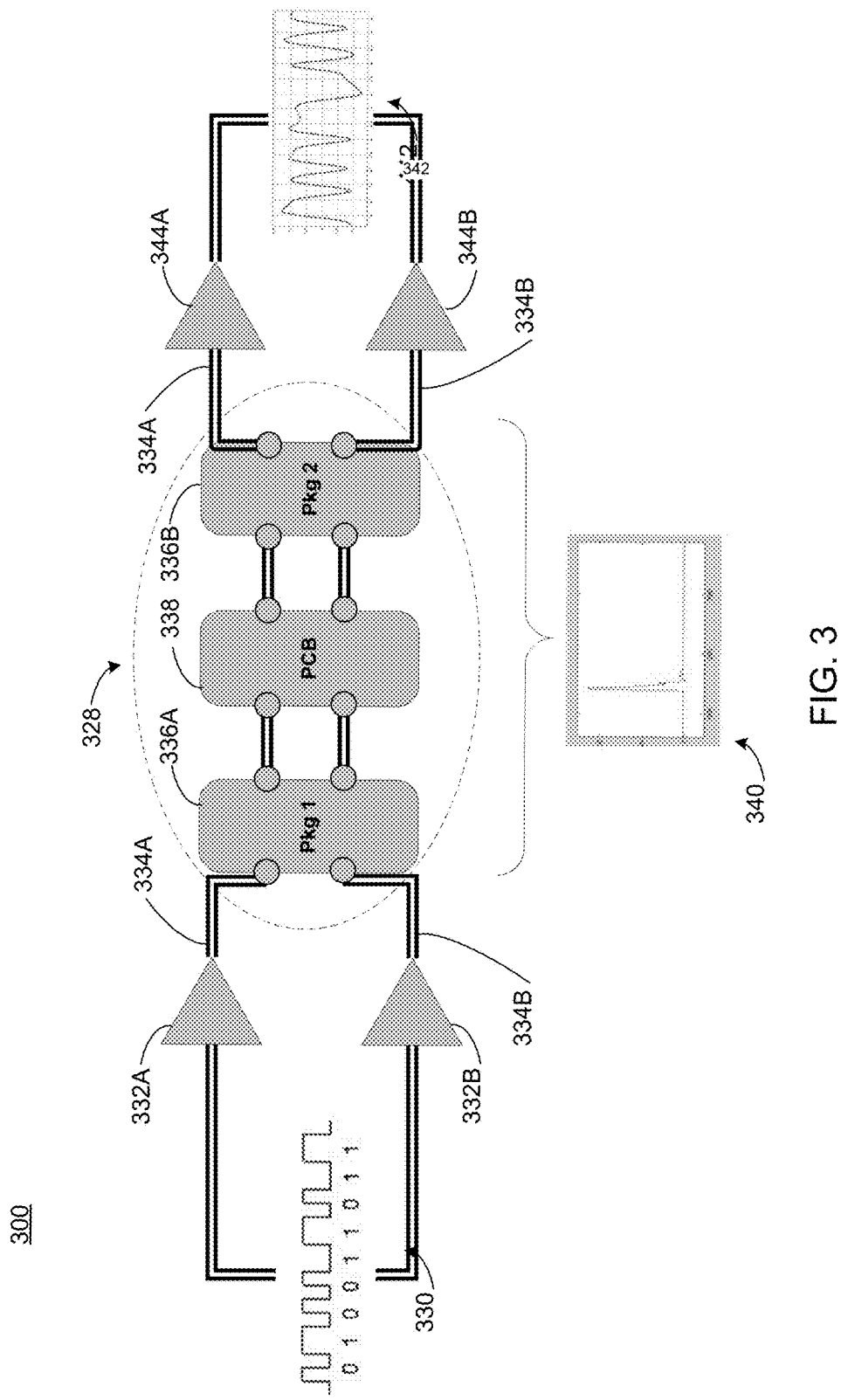
FIG. 3 is a diagram depicting an embodiment incorporating receiver termination process in accordance with the present disclosure.

In one example and referring also to FIG. 3, a channel may be simulated using differential signaling. In this example, a single differential bit 330 (e.g., a bit stream and/or a signal) may be transmitted from two transmitter drivers 332A, 332B on two wires 334A, 334B to the at least one channel 328. The single differential bit 330 may be distributed across the two wires 334. The at least one channel 328 may include one or more interconnect packages 336A, 336B and/or a PCB 338. As will be discussed in greater detail below, the channel 328 may be modeled by generating an impulse response 339 representative of the at least one channel 328. The impulse response 340 of the at least one channel 328 may be convolved with the single differential bit 330 and/or a unique bit stream (not shown) to generate a simulated waveform 342 based upon, at least in part, the single differential bit 330. In this example, a single differential bit 330 is applied and two wires 334A, 334B are required to generate the simulated waveform 342 received at two receivers 344A, 344B. However, differential signaling may be limited to transmitting a single differential bit. Furthermore, differential signaling may not support simulation of topologies that transmit two or more bits across multiple wires and subsequently recover them.

Figure 4:
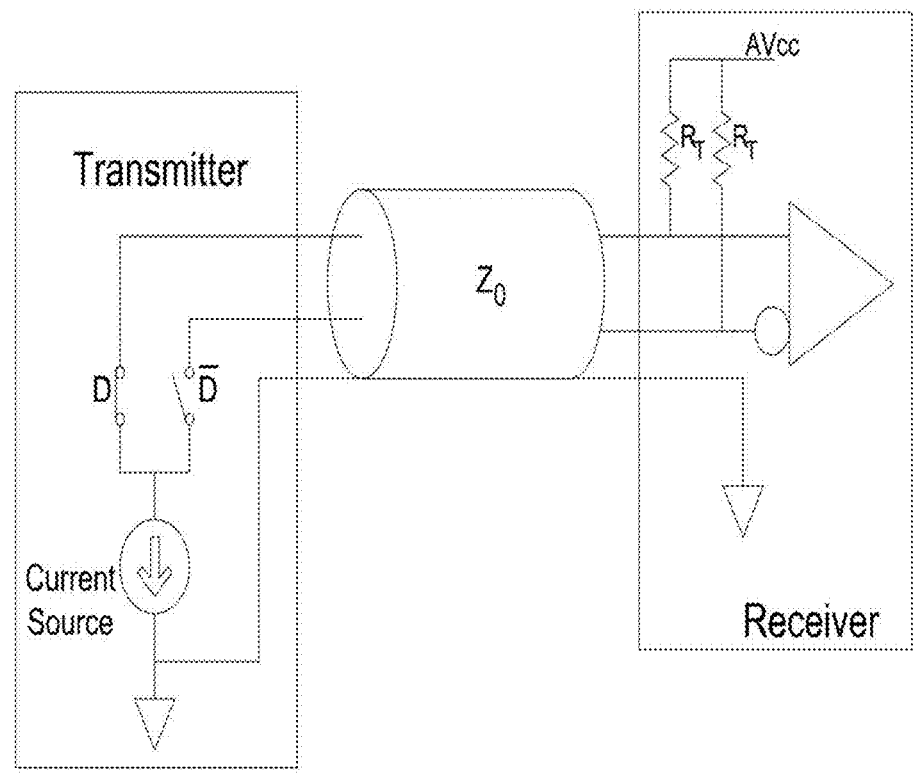
FIG. 4 is a diagram depicting an embodiment incorporating receiver termination process in accordance with the present disclosure.

Referring now to FIG. 4, an embodiment of receiver termination process 10 is provided. In this particular embodiment a system 400 is provided, which includes transmitter 402 and receiver 404. In some embodiments, system 400 may include a 3.3V supply referred 50 ohm termination using 1.8V devices. In some embodiments, the system may be configured to turn off the termination units in the absence of receiver supply (Avcc). System 400 may also be configured to limit leakage from data link to supply/ground to within 20uA in the absence of receiver supply.

Figure 5:
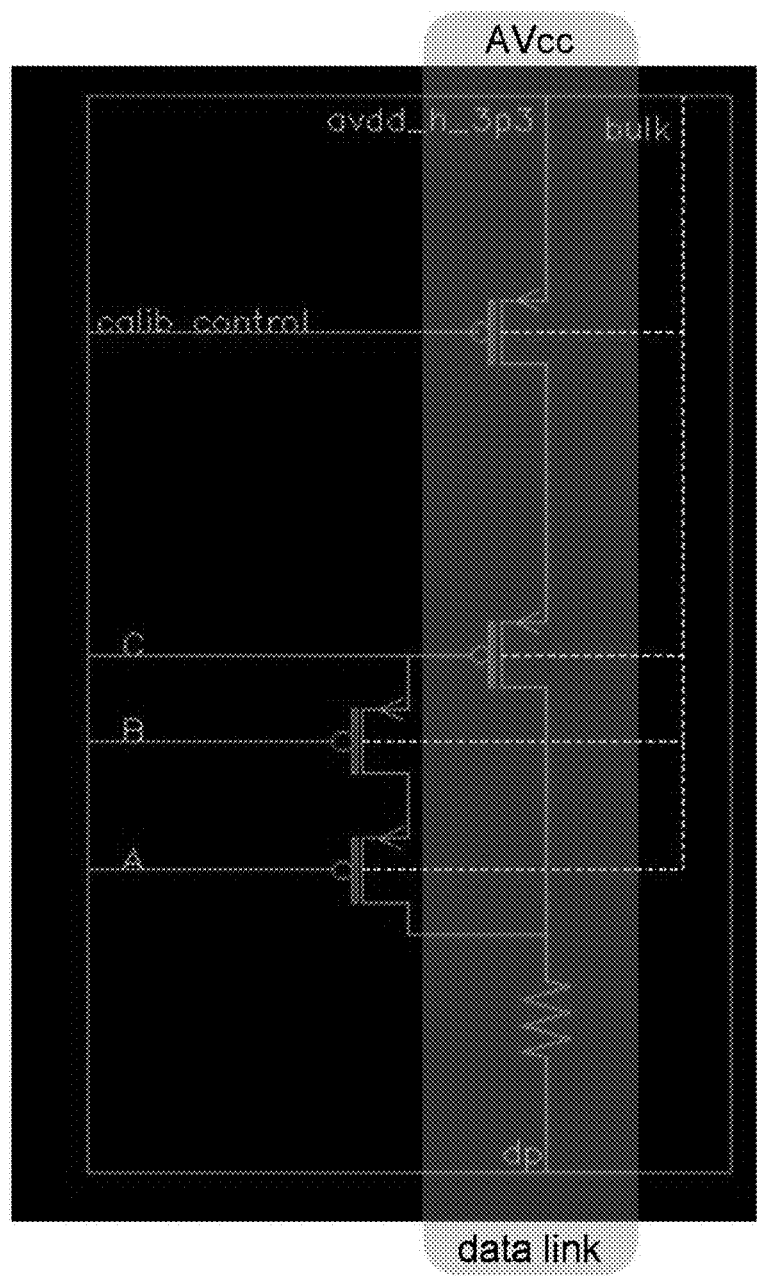
FIG. 5 is a schematic depicting an embodiment incorporating receiver termination process in accordance with the present disclosure.

Referring also to FIG. 5, another embodiment depicting circuitry 500 consistent with receiver termination process 10 is provided. Circuitry 500 may be configured to prevent overstress on 1.8V devices in the presence of $AV_{cc}$ supply. As shown in the Figure, a cascading configuration of one or more devices may be arranged in the main termination path, which is highlighted in the Figure. In some embodiments, the first transistor (e.g. pmos, etc.) in the cascading configuration maybe be used for resistance calibration. In operations, the circuit may operate to limit leakage from the data link to supply/ground. For example, cascading switches "A" and "B" may be configured to cut-off the termination branch if the transmitter drives data in the absence of the receiver supply. Additionally and/or alternatively, the gate controls of "A" and "B" may be pulled to $AV_{cc}$ during 50 ohm termination mode. In some embodiments, in order to limit leakage in the absence of $AV_{cc}$, switches "A" and "B" may be turned on, which pulls up node "C" to the data link level thus cutting off the termination.

Figure 6:
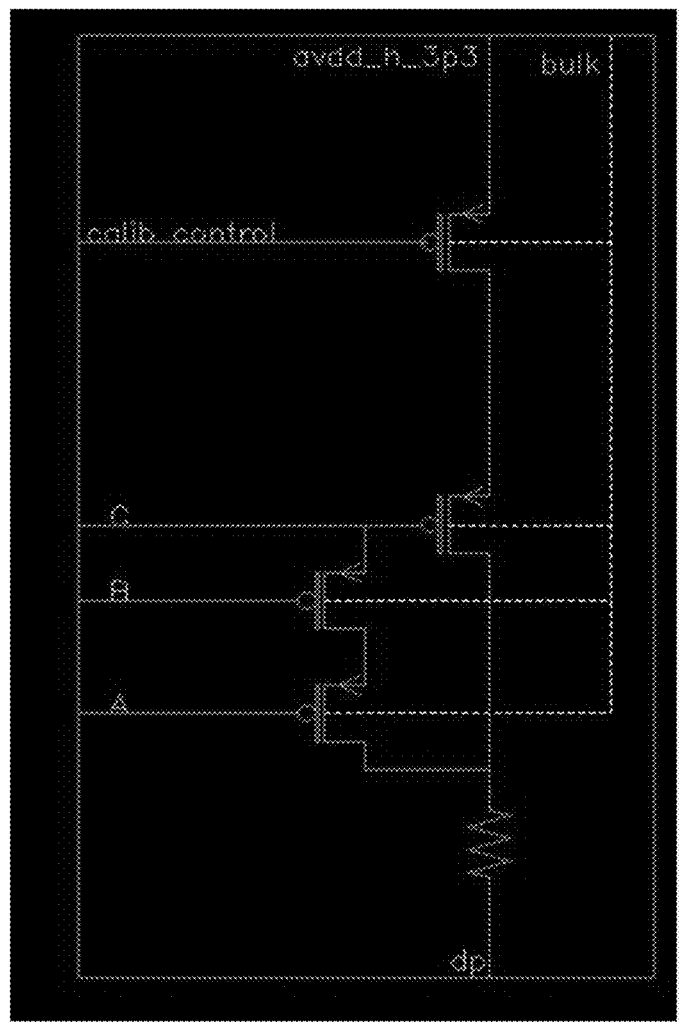
FIG. 6 is a diagram depicting an embodiment incorporating receiver termination process in accordance with the present disclosure.

Referring also to FIG. 6, another embodiment depicting circuitry 600 consistent with receiver termination process 10 is provided. In this particular embodiment, the generation of signals "A", "B", and "C" is provided. The Table shown in FIG. 6 summarizes an example of the required behavior from signals A, B, and C. For example, signal 'A' may be generated as $(AV_{CC}+dp)/2$. When $AV_{CC}$ is present, the data link ('DP') may be pulled to $AV_{CC}$ level, thus 'A' is $(AV_{CC}+AV_{CC})/2=AV_{CC}$ (as required in the third scenario depicted in the table of FIG. 6). In some embodiments, and with regards to signal 'C', in presence of $AV_{CC}$, 'C' may be $AV_{CC}/2$. In absence of $AV_{CC}$, switches 'A' and 'B' may be turned ON and 'C' may be driven to 'DP' level (as required in the second scenario in the table of FIG. 6). This may operate to cut off the termination branch.

Figure 7:
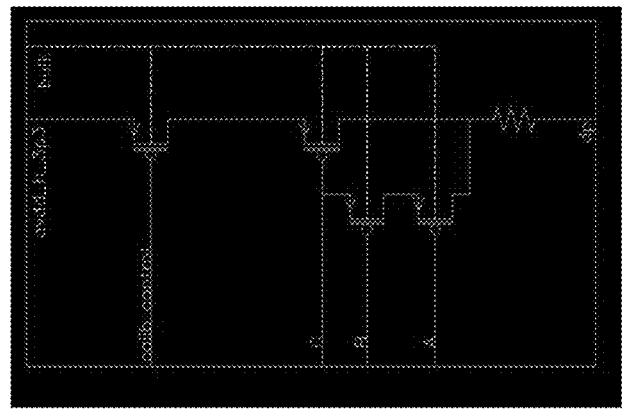
FIG. 7 is a schematic depicting an embodiment incorporating receiver termination process in accordance with the present disclosure.
Figure 7:
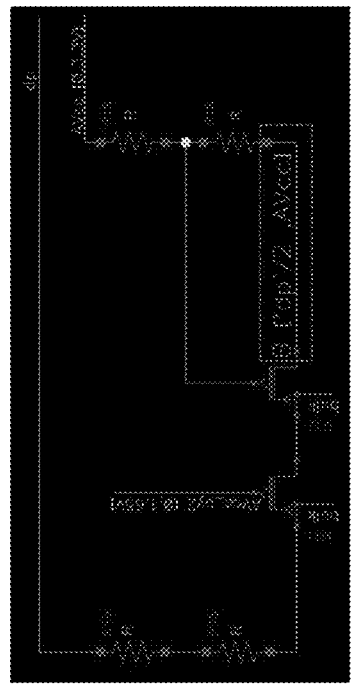

Referring also to FIG. 7, another embodiment depicting circuitry 700 consistent with receiver termination process 10 is provided. In this particular embodiment, the generation of signals "A", "B", and "C" is provided. In some embodiments, 'B' may be difficult as it is a unique function of $AV_{cc}$ and 'DP'. The circuitry 700 shown in FIG. 7 may be configured to generate such a signal.

Figure 8:
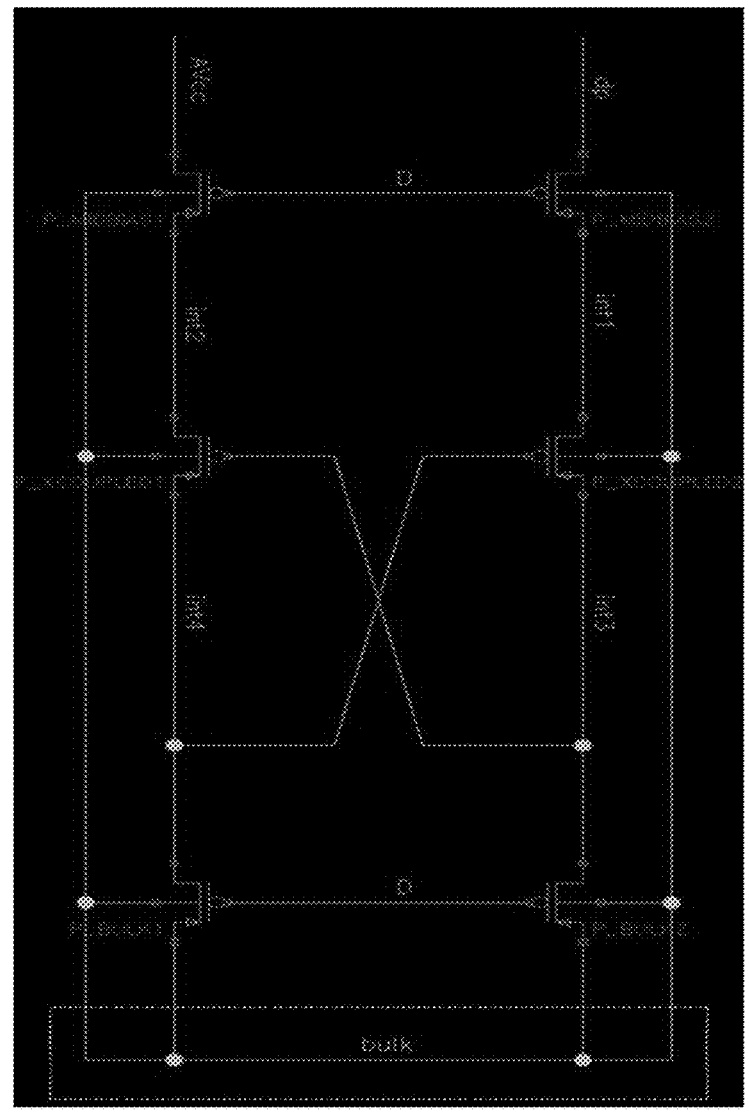
FIG. 8 is a diagram depicting an embodiment incorporating receiver termination process in accordance with the present disclosure.

Referring also to FIG. 8, another embodiment depicting circuitry 800 consistent with receiver termination process 10 is provided. In this particular embodiment, bulk node generation circuitry is provided. In some embodiments, the bulk node may be generated through a peak detector circuit. Circuitry 800 may be configured to output a greater voltage level out of data link and $AV_{CC}$. Circuitry 800 includes two paths to bulk, for example, one from $AV_{CC}$ and other from DP. Depending on which voltage is higher, the bulk node may charge to that level. The behavior of internal signal 'D' is provided in the Table shown in FIG. 8. In presence of $AV_{CC}$, signal 'D' may be generated as $AV_{CC}/2$. In the absence of $AV_{CC}$, signal 'D' may be generated as 0.75*DP-Vgs (switch).

Figure 9:
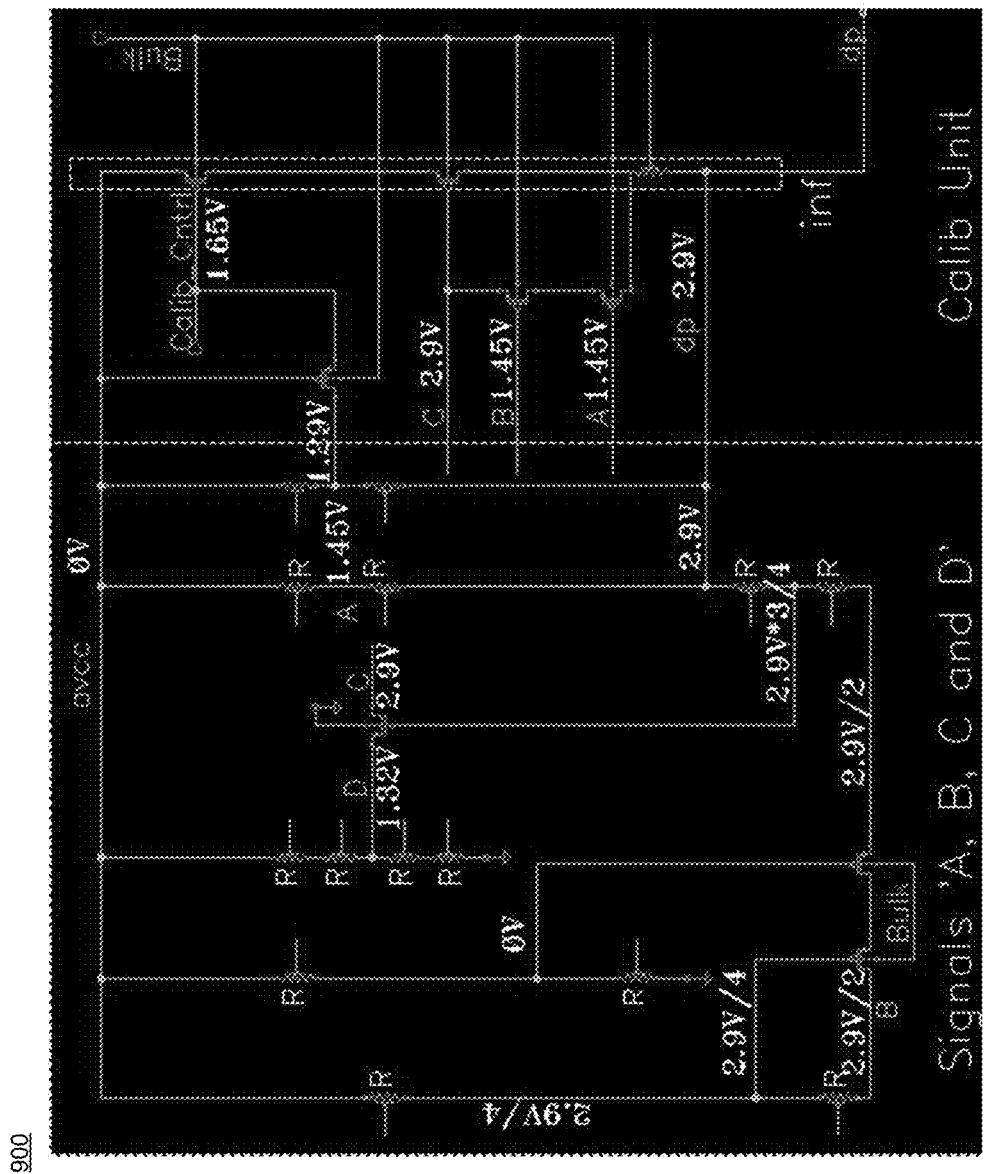
FIG. 9 is a schematic depicting an embodiment incorporating receiver termination process in accordance with the present disclosure.
Figure 10:
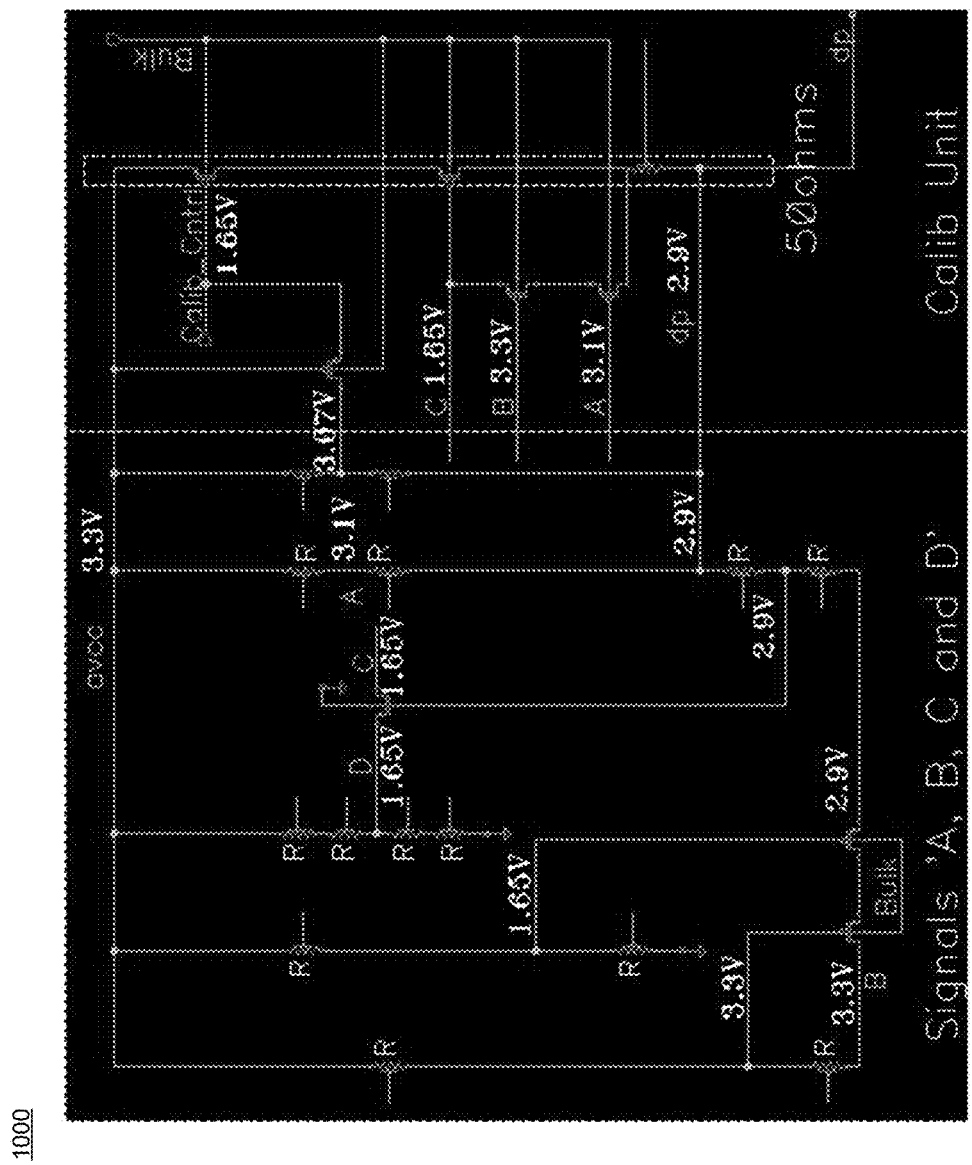
FIG. 10 is a schematic depicting an embodiment incorporating receiver termination process in accordance with the present disclosure.
Figure 11:
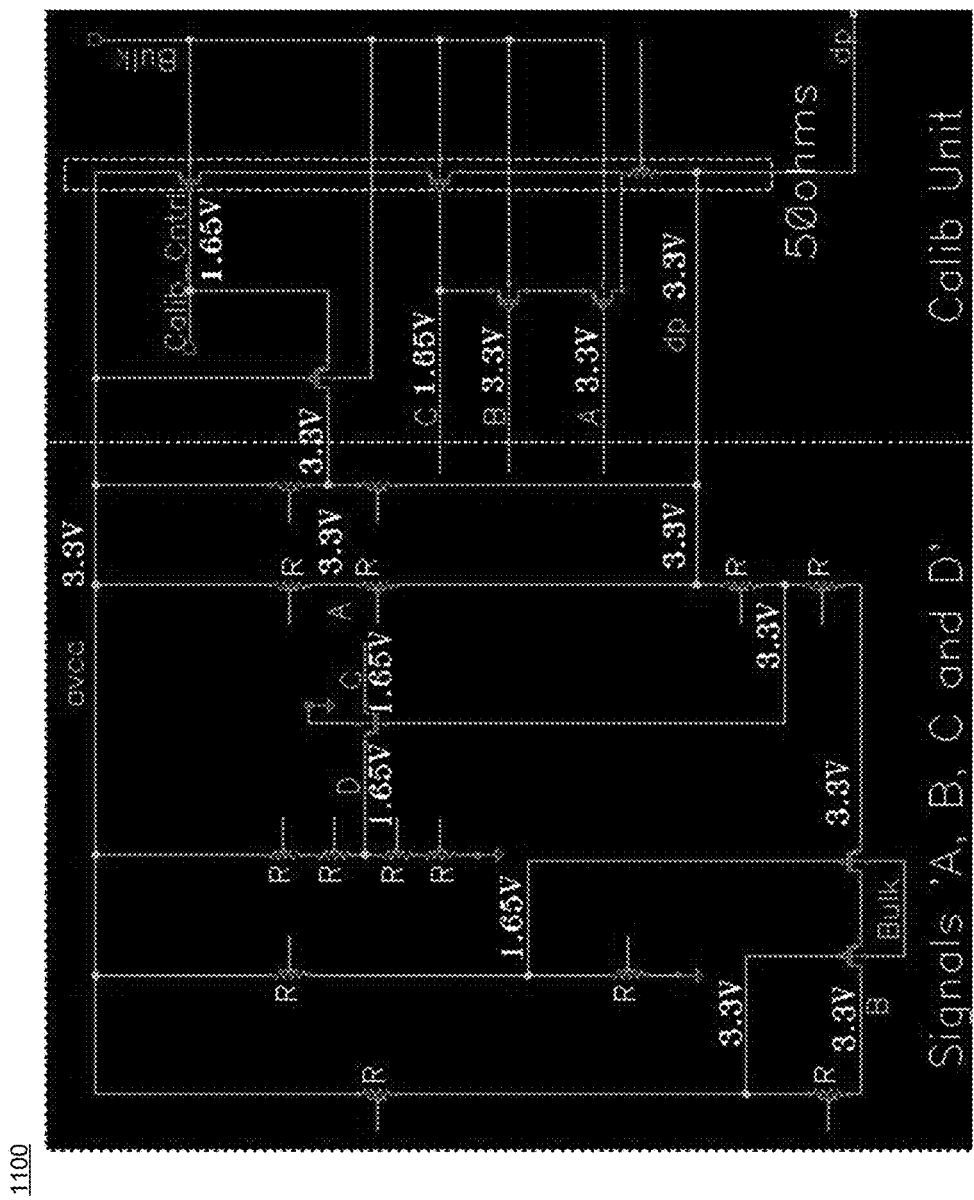
FIG. 11 is a schematic depicting an embodiment incorporating receiver termination process in accordance with the present disclosure.

Referring now to FIGS. 9-11, embodiments showing one or more simulation results in accordance with receiver termination process 10 are provided. In FIG. 9, the scenario simulated includes $AV_{CC}$=0V and a Data State=Driven. In this example, all devices are 1.8V devices. As can be seen, even in the absence of $AV_{CC}$ supply, the termination unit is turned off, thus limiting leakage from the DP pad. In FIG. 10, the scenario simulated includes $AV_{CC}$=3.3V and a Data State=Driven. In this example, all devices are 1.8V devices. As can be seen, no device sees more than 2V across its four junctions. In FIG. 11, the scenario simulated includes $AV_{CC}$=3.3V and a Data State=Un-Driven. In this example, all devices are 1.8V devices. As can be seen, no device sees more than 2V across its four junctions.

Figure 12:
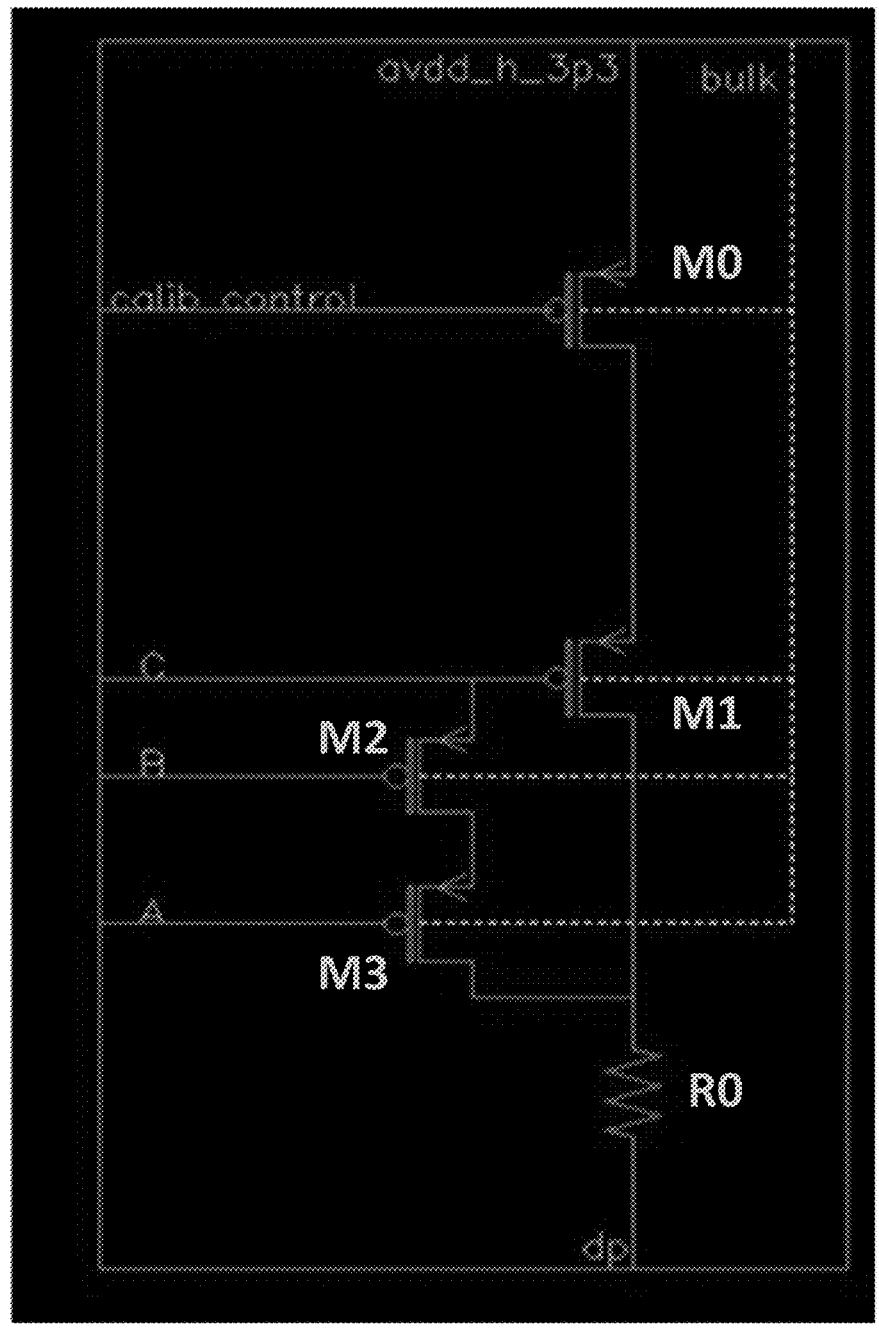
FIG. 12 is a schematic depicting an embodiment incorporating receiver termination process in accordance with the present disclosure.
Figure 13:
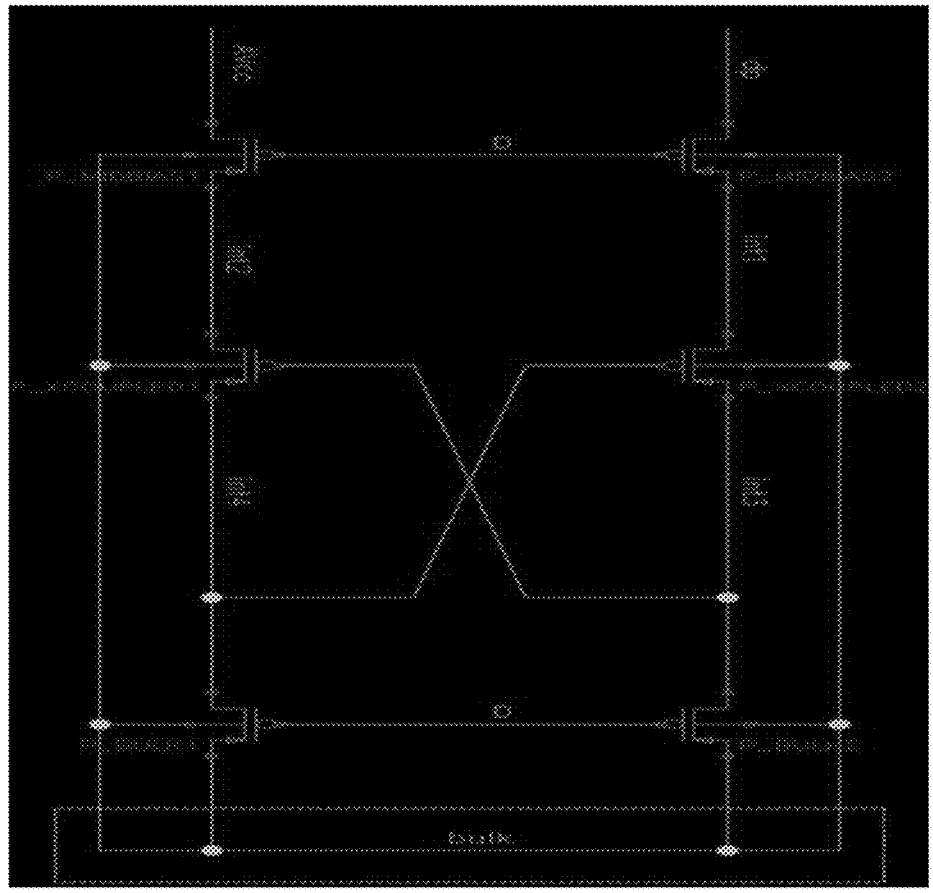
FIG. 13 is a diagram depicting an embodiment incorporating receiver termination process in accordance with the present disclosure.

Referring now to FIGS. 12-13, embodiments consistent with receiver termination process 10. Embodiments may include a receiver termination for a DC coupled HDMI system. In some embodiments, this receiver termination may be terminated to a 3.3V supply at an HDMI sink and the termination cell may be comprised of a calibration digital to analog converter ("DAC") where each arm of the DAC may include, but is not limited to, a calibration switch M0 (e.g., a 1.8V MOSFET), a cascaded switch M1 (e.g., a 1.8V MOSFET), and a resistor R0.

In some embodiments, the M0 transistor may be controlled by a calibration code control to turn on and trim the output impedance. A protection transistor M1 may be provided in order to protect M0. M2 and M3 are transistors that may be configured to support biasing of M1 and a resistor R0 may be arranged in a cascaded arrangement as shown in the Figure.

In operation, and in one particular embodiment, a supply ON condition may include the following conditions in one example: avdd_h_3p3=$AV_{CC}$ (typically 3.3V), Dp=driven or undriven from outside PHY, R termination (ohm)=50 ohm, Calib control: $AV_{CC}$ or $AV_{CC}/2$, Node A=$AV_{CC}$, Node B=$AV_{CC}$, and Node C=$AV_{CC}/2$. A supply OFF condition may include the following conditions in one example: avdd_h_3p3=0V, dp=driven from outside PHY, R termination (ohm)=inf, Calib control: X, Node A=dp/2, Node B=dp/2, and Node C=dp.

FIG. 13 shows an example of a bulk generation circuit, which generates 'Bulk' voltage according to table shown in FIG. 13. In some embodiments, this may include peak detector circuitry as described above.

Embodiments of the receiver termination process 10 described herein provide a number of advantages over previous systems. For example, and with respect to power considerations, any extra current consumed by the auxiliary circuit is approximately 30 uA. With respect to performance, the extra circuitry does not add any significant parasitic on the data path. Moreover, the circuit meets reliability standards for all the devices in all the scenarios to support. Design portability it is also far easier using the teachings of the present disclosure; due to lesser layout complexity.

Receiver termination process 10 may be configured to operate with various EDA applications such as those available from the Assignee of the present disclosure, which may allow the user to simulate a channel associated with an integrated circuit design. In some embodiments, the electronic circuit design may be received at a graphical user interface associated with the EDA application 20. In some embodiments, two or more inputs and a user definition for relationships between the two or more inputs of the comparator block and the two or more simulated outputs may be received at a graphical user interface associated with EDA application 20.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. An apparatus for use in a transition-minimized differential signaling link ("TMDS") receiver comprising:
    an integrated circuit associated with a High-Definition Multimedia Interface ("HDMI") system, the integrated circuit electrically connected with a 3.3V voltage supply, the integrated circuit including a first transistor, a second transistor, and a resistor arranged in a cascaded configuration along a termination path, wherein the first transistor includes calibration code control configured to adjust an output impedance, wherein the first transistor and the second transistor are 1.8 V metal-oxide-semiconductor field-effect transistors ("MOSFETs"), wherein the integrated circuit further includes a third transistor and a fourth transistor arranged in a second cascaded configuration and arranged to bias the second transistor, wherein if the third transistor and the fourth transistor are switched on, the second transistor is pulled up to a data link level.

2. The apparatus of claim 1, wherein the integrated circuit further includes a bulk generation circuit.

3. The apparatus of claim 2, wherein the bulk generation circuit includes a peak detector circuitry.

4. A direct current ("DC") coupled High-Definition Multimedia Interface ("HDMI") system comprising:
    a transmitter; and
    a receiver in communication with the transmitter, the receiver having a calibration digital to analog converter ("DAC") including a plurality of integrated circuits associated with the High-HDMI system, wherein each of the integrated circuits is electrically connected with a 3.3V voltage supply and includes a first transistor, a second transistor, and a resistor arranged in a cascaded configuration along a termination path, wherein the first transistor includes calibration code control, wherein the first transistor and the second transistor are 1.8 V metal-oxide-semiconductor field-effect transistors ("MOSFETs"), wherein the integrated circuit further includes a third transistor and a fourth transistor arranged in a second cascaded configuration and arranged to bias the second transistor, wherein if the third transistor and the fourth transistor are switched on, the second transistor is pulled up to a data link level.

5. The system of claim 4, wherein the integrated circuit further includes a bulk generation circuit.

6. The system of claim 4, wherein the calibration DAC includes a plurality of arms and each of the plurality of arms includes one of the plurality of integrated circuits.

7. The system of claim 5, wherein the bulk generation circuit includes a peak detector circuitry.

8. A method for use in a transition-minimized differential signaling link ("TMDS") receiver comprising:
    providing an integrated circuit associated with a High-Definition Multimedia Interface ("HDMI") system, the integrated circuit electrically connected with a 3.3V voltage supply, the integrated circuit including a first transistor, a second transistor, and a resistor arranged in a cascaded configuration along a termination path, wherein the first transistor and the second transistor are 1.8 V metal-oxide-semiconductor field-effect transistors ("MOSFETs");
    adjusting an output impedance of the first transistor using a calibration code control; and
    reducing leakage of a data link associated with the termination path wherein reducing leakage includes biasing the second transistor using a third transistor and a fourth transistor arranged in a second cascaded configuration, wherein if the third transistor and the fourth transistor are switched on, the second transistor is pulled up to a data link level.

9. The method of claim 8, wherein the integrated circuit further includes a bulk generation circuitry.

10. The method of claim 9, wherein the bulk generation circuitry includes peak detection circuitry.

11. The method of claim 8, wherein providing the integrated circuit includes providing the integrated circuit within each arm of a digital to analog converter ("DAC").

* * * * *